United States Patent [19]

Rohan et al.

[11] Patent Number: 5,521,507
[45] Date of Patent: May 28, 1996

[54] GRADIENT COIL POWER SUPPLY AND IMAGING METHOD

[75] Inventors: Michael L. Rohan, Cambridge; Robert R. Evans, Framingham, both of Mass.

[73] Assignee: Advanced NMR Systems, Inc., Wilmington, Mass.

[21] Appl. No.: 383,418

[22] Filed: Feb. 3, 1995

[51] Int. Cl.$^6$ ................................ G01V 3/00; G01V 3/14
[52] U.S. Cl. ............................................. 324/322; 324/318
[58] Field of Search .................................. 324/301, 309, 324/318, 322

[56] References Cited

U.S. PATENT DOCUMENTS

| | | | |
|---|---|---|---|
| 4,628,264 | 12/1986 | Rzedzian | 324/322 |
| 4,710,716 | 12/1987 | Keren et al. | 324/309 |
| 4,736,160 | 4/1988 | Sano et al. | 324/312 |
| 4,847,560 | 7/1988 | Sattin | 324/309 |
| 4,871,966 | 10/1989 | Smith et al. | 324/309 |
| 4,933,639 | 6/1990 | Barker | 324/309 |
| 5,085,219 | 2/1992 | Ortendahl et al. | 128/653.5 |
| 5,107,838 | 4/1992 | Yamaguchi et al. | 128/653.2 |
| 5,111,820 | 5/1992 | Axel et al. | 128/653 A |
| 5,278,506 | 1/1994 | Schmitt | 324/322 |

FOREIGN PATENT DOCUMENTS

WO88/04058  6/1988  WIPO .................. G01R 33/20

*Primary Examiner*—Sandra L. O'Shea
*Assistant Examiner*—Mack Haynes
*Attorney, Agent, or Firm*—Fish & Richardson

[57] ABSTRACT

In a magnetic resonance imaging system in which the read and phase directions are rotated with respect to the orthogonal gradient coil directions, a gradient coil is driven to generate a gradient waveform having a segment, either sinusoidal or linear, that approximates the sum of the simultaneous non-zero components of the read and phase gradient waveforms in the direction of the gradient coil. Resonant circuits, each including a gradient coil, generate simultaneous periodic gradient coil waveforms in which the integral over each waveform period is non-zero. First and second capacitive elements in the resonant power supply are electrically connected to the gradient coil through a switch and a bridged network, respectively. The bridged network selectively provides current flow paths between the coil and either of the terminals of the second capacitive element.

22 Claims, 14 Drawing Sheets

GRADIENT COIL POWER SUPPLY AND IMAGING METHOD

BACKGROUND OF THE INVENTION

This invention relates to producing modulated gradient fields in magnetic resonance imaging (MRI) systems.

In a typical MRI system, three electromagnetic gradient coils are driven using respective power supplies to generate magnetic field gradients in each of three orthogonal (e.g., x, y, and z) directions, termed "gradient coil directions." The magnetic fields generated by the gradient coils generally have components parallel to the direction of a main magnetic field, where the strengths of the components vary spatially (e.g., linearly) in each of the respective gradient coil directions. The gradient coils are typically driven to generate "read," "phase," and, "slice" gradient waveforms, where the plane or cross-section to be imaged lies parallel to the plane defined by the directions of the read and phase gradients.

A variety of gradient coil power supplies are known for generating magnetic field gradients for MRI systems. In some systems, the power supply consists only of an amplifier, which drives the gradient coil directly to produce the desired gradient waveforms. The amplifiers can be controlled to obtain images of planes that lie at oblique angles to the gradient coil directions.

In other MRI systems, such as those disclosed in Rzedzian U.S. Pat. No. 4,628,264, incorporated herein by reference in its entirety, the gradient coil is connected in parallel with a capacitor to form a parallel resonant circuit. And in still other MRI power supplies, such as those disclosed in Rzedzian et al. U.S. Pat. No. 5,285,161, incorporated herein by reference in its entirety, the gradient coil is connected in series with a capacitor to form a series resonant circuit. In both the parallel and the series resonant power supplies, an amplifier drives the coil-capacitor circuit at or near its resonant frequency, generating a sinusoidally varying gradient waveform. The power supplies can be controlled to interrupt the resonant sinusoidal waveform for periods of arbitrary duration.

SUMMARY OF THE INVENTION

In one general aspect of the invention, the read and phase directions are rotated with respect to the gradient coil directions. One of the gradient coils is driven to generate a gradient waveform having a segment, either sinusoidal or linear, that approximates the sum of the simultaneous non-zero components of the read and phase gradient waveforms in the direction of the gradient coil.

Among other advantages, this aspect of the invention allows the read-phase plane, that is, the clinical imaging (or scan) plane, to be rotated through one or more angles with respect to the gradient coil directions. Thus, an object in which the cross-section of interest does not lie perpendicular to any of the x, y, or z gradient coil axes need not by physically rotated in order to obtain a satisfactory image. Rather, the image plane itself can be rotated as necessary to obtain an image of the desired slice of the object.

Moreover, because the non-zero components of the read and phase gradient waveforms are generated simultaneously, for given gradient waveform frequencies and amplitudes the total time needed to sample a single image is shorter than if the non-zero components were generated sequentially.

In preferred embodiments, all three of the gradient coils are driven using resonant power supplies to generate periodic waveforms that approximate the summed components of the read and phase gradient waveforms in each of the x, y, and z gradient coil directions. In particular, the integral over one period of each gradient coil waveform equals the integral over the same period of the summed components of the read and phase gradient waveforms in the direction of that waveform. Each power supply includes two capacitive elements that are precharged prior to the initiation of the gradient waveforms to generate sinusoidal resonances at desired amplitudes when switches connecting the respective capacitive elements to the coils are closed. In operation, one of the two switches is opened (e.g., after a half-period sinusoidal segment has been generated) at substantially the same time that the other switch is closed.

In another aspect of the invention, a plurality of resonant circuits, each including a gradient coil, are driven to generate simultaneous periodic gradient waveforms in which the integral over each waveform period is non-zero.

Among other advantages of this aspect of the invention, the resonant circuits can be driven at their respective resonant frequencies, reducing the amount of power necessary to produce a gradient waveform of a desired amplitude (e.g., a DC-offset sinusoidal waveform or a waveform comprised of sinusoidal segments).

Another aspect of the invention includes a resonant power supply in which first and second capacitive elements are electrically connected to the gradient coil through a switch and a bridged network, respectively. The bridged network selectively provides current flow paths between the coil and either of the terminals of the second capacitive element.

In preferred embodiments, a controller controls the switch and the bridge in accordance with a predetermined, periodic pattern. The bridge includes four bipolar switches, two connected to one terminal of the second capacitive element, and two connected to the other. An amplifier connected to the coil drives the coil with a voltage signal synchronized to the gradient waveform.

Other features and advantages of the invention will be apparent from the description of the preferred embodiments, and from the claims.

BRIEF DESCRIPTION OF THE DRAWINGS

FIG. 4b is a detail view of one portion of one of the signals of FIG. 4a.

FIG. 5a is a timing diagram showing signals produced by three separate circuits, each having the structure shown in FIG. 2a.

FIG. 5b is a detail view of one portion of one of the signals of FIG. 5a, and showing a switch control sequence for the structure depicted in FIG. 2a.

FIG. 6a is another timing diagram showing signals produced by three separate circuits, each having the structure shown in FIG. 2a.

FIG. 6b is a detail view of one portion of one of the signals of FIG. 6a, and showing a switch control sequence for the structure depicted in FIG. 2a.

FIG. 8a is another timing diagram showing signals produced by three separate circuits, each having the structure shown in FIG. 2a.

FIG. 8b is a detail view of one portion of one of the signals of FIG. 8a, and showing a switch control sequence for the structure depicted in FIG. 2a.

FIG. 10a is a timing diagram showing signals produced by three separate circuits, each having the structure shown in FIG. 9a.

FIG. 10b is a detail view of one portion of one of the signals of FIG. 10a.

DESCRIPTION OF THE PREFERRED EMBODIMENTS

Figure 1:
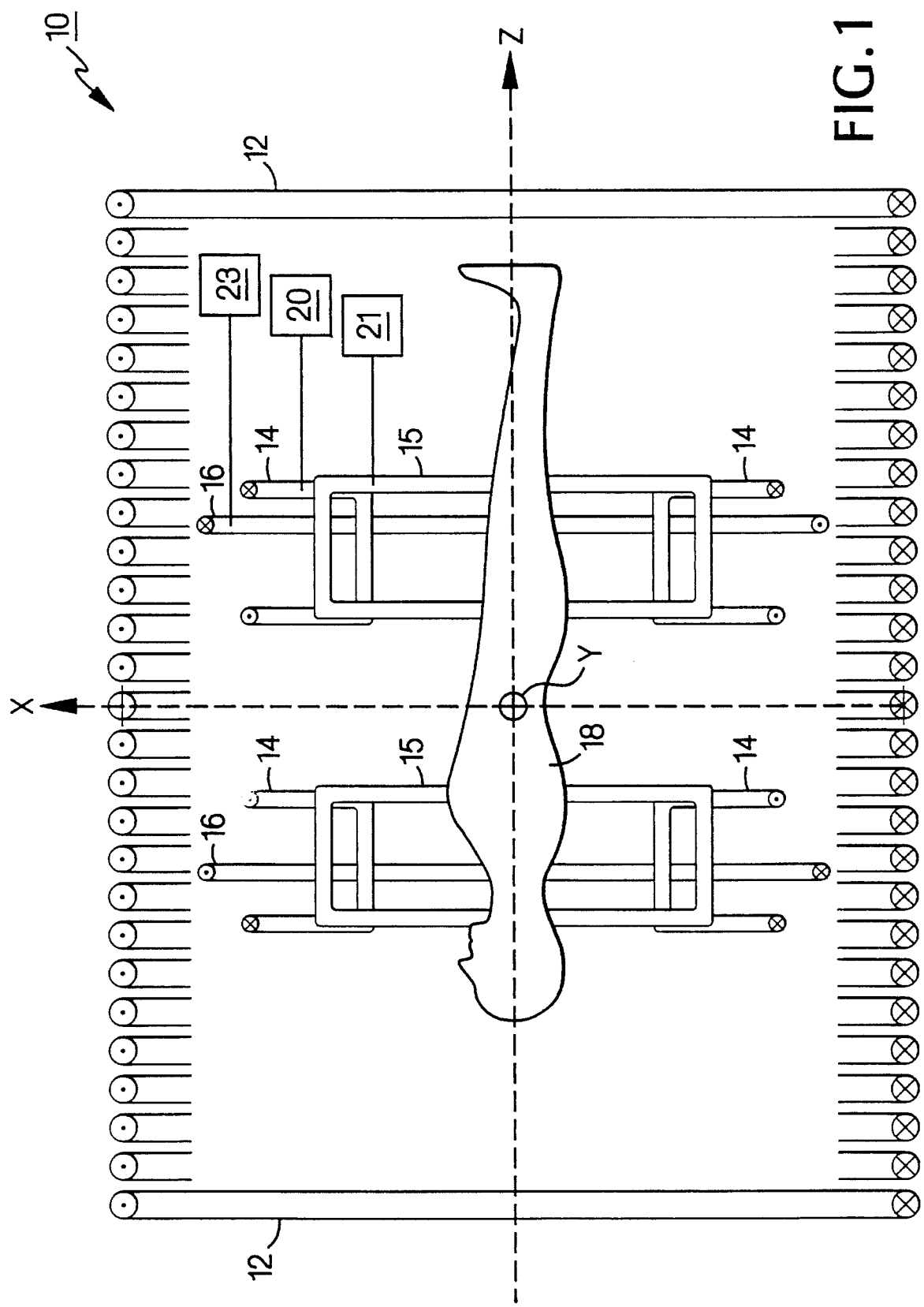
FIG. 1 is a cross-sectional, diagrammatic view of an arrangement of MRI coils around a subject body.

With reference to FIG. 1, magnetic coils 10 are oriented in relation to orthogonal x, y, and z axes. As described in U.S. Pat. No. 4,628,264 to Rzedzian, incorporated herein in its entirety by reference, a whole-body coil 12 generates a static main magnetic field, and gradient coils 14, 15, 16 (shown diagrammatically) provide magnetic field gradients $G_x$, $G_y$, and $G_z$ in the respective x, y, and z gradient coil directions. Coils 10 surround subject body 18. A separate resonant power supply (RPS) 20, 21, 23 drives each of gradient coils 14, 15, 16.

Figure 2A:
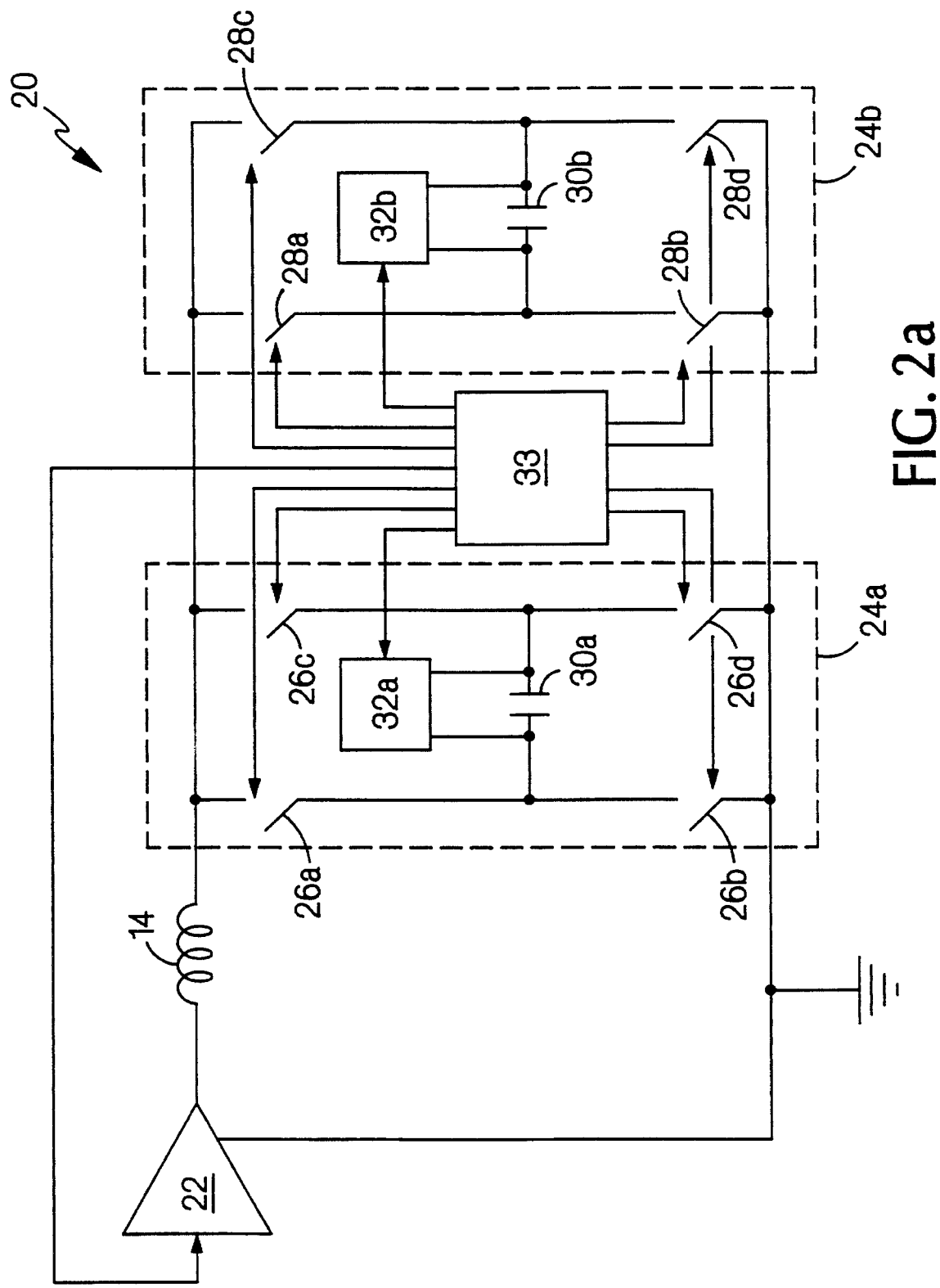
FIG. 2a is a simplified block diagram helpful for understanding one embodiment of the invention.

A topology for RPS 20 for driving gradient coil 14 is shown in FIG. 2a. RPS 20 includes a controllable gradient amplifier 22, such as a linear amplifier or a switching amplifier, in series with gradient coil 14 and two bridged capacitor networks 24a, 24b. Each bridged capacitor network 24a, 24b includes four switches 26a, 26b, 26c, 26d; 28a, 28b, 28c, 28d, a capacitor 30a, 30b, and an associated charging circuit 32a, 32b. Switches 26a, 26b, 26c, 26d; 28a, 28b, 28c, 28d may be bipolar switches, such as insulated gate bipolar transistors (IGBTs), or unipolar switches such as silicon controlled rectifiers arranged in pairs. A suitable charging circuit 32a, 32b is described in U.S. Pat. No. 5,245,287 to Rzedzian, incorporated herein in its entirety by reference. Alternatively, a single charging circuit that can be switched between capacitors 30a, 30b can be substituted for charging circuits 32a, 32b, or capacitors 30a, 30b can be charged directly from amplifier 22. A run/charge controller 33 asserts control signals for controlling the state of switches 26a, 26b, 26c, 26d; 28a, 28b, 28c, 28d, and also controls the operation of chargers 32a, 32b and amplifier 22. In order to accommodate transients in the voltage signal supplied by amplifier 22 when switches 26a, 26b, 26c, 26d; 28a, 28b, 28c, 28d are opened and closed by controller 33, it may be necessary to include additional switches and snubbers (not shown) in RPS 20.

RPSs 21, 23, for driving gradient coils 15, 16, are identical to RPS 20, and are similarly controlled.

Figure 2B:
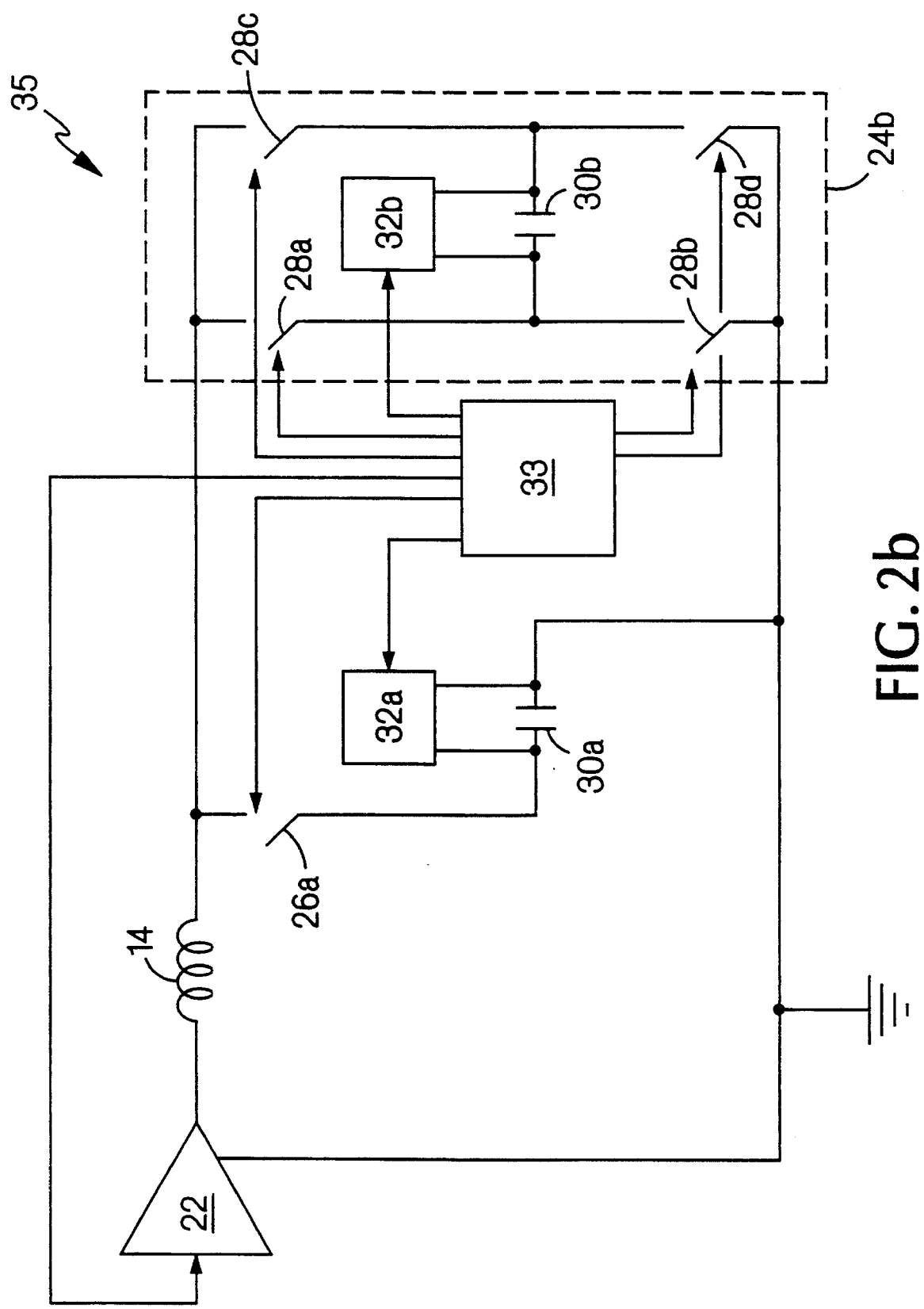
FIG. 2b is a simplified block diagram helpful for understanding another embodiment of the invention.

An alternate RPS 35 is shown in FIG. 2b. (For convenience and clarity, many of the numerals used in FIG. 2a are used to identify also the principle components and subassemblies in FIG. 2b, as well as in the other alternate RPS embodiments shown and described herein.) RPS 35 is identical to RPS 20, except switches 26b, 26c have been eliminated, and switch 26d has been replaced with a permanently conducting section.

As disclosed in Rzedzian U.S. Pat. No. 4,940,941, incorporated herein by reference in its entirety, and also with reference to FIG. 3, echo planar imaging (EPI), known in the prior art, involves the generation of gradient waveforms in orthogonal read, phase, and slice directions. A gradient waveform is a representation of how the strength of a magnetic field gradient (e.g., in units of gauss/cm) varies with time. For each gradient coil 14, 15, 16, there is a direct relationship between the strength of the magnetic field gradient and the magnitude of the current signal supplied to the gradient coil. Thus, if the read, phase, and slice directions are parallel to the x, y, and z gradient coil directions, the respective current signals used to drive gradient coils 14, 15, 16 will generally have the same shapes as the gradient waveforms shown in FIG. 3, although the relative amplitudes of the current signals need not be (and in general will not be) identical to the relative amplitudes of the gradient waveforms.

In EPI, as well as in some other imaging techniques, a slice-select gradient 34 (e.g., a square or trapezoidal pulse of amplitude $I_s$) is first generated in the slice direction, followed by pre-phasing gradient pulses 36, 38 in the read and phase directions and, optionally, a refocus gradient pulse 40 in the slice direction.

The acquisition sequence, which follows the above pulse sequence, includes a read-out gradient waveform 42 in the read direction and a phase-coding gradient waveform 44 in the phase direction. Read-out gradient waveform 42 is a sinusoid of amplitude $I_r$:

$$I_r(t) = I_r \sin \omega_r t \qquad (1)$$

Phase-coding gradient waveform 44 is a series of positive, relatively high-frequency cosine "blips" of amplitude $I_p$ centered around the zero-crossings 46 (both positive-going and negative-going) of read-out gradient waveform 42:

$$I_p(t) = I_p \cos \omega_p (t \bmod T_r), \ |t \bmod T_r| < T_p/2 \qquad (2)$$

where $T_r$ equals $\pi/\omega_r$, one-half of the period of the read-out gradient waveform, and $T_p$ equals $\pi/\omega_p$, one-half of the period of the phase-coding gradient waveform. Alternatively, the blips of phase-coding gradient waveform 44 could be negative.

Slice-select gradient pulse 38, together with a simultaneously generated radio-frequency (RF) excitation pulse, excite the nuclei (not shown) in a planar slice of subject body 18. The axial location of this planar slice, which lies perpendicular to the slice direction, is determined by the frequency of the RF excitation pulse. To generate an image, read-out gradient waveform 34 and phase-coding gradient waveform 36 are then employed to evaluate the spatially varying density of the excited nuclei in the selected slice. Thus, slice-select gradient pulse 38 determines the cross-section of subject body 18 (i.e., the image plane) that is imaged. Accordingly, if gradient coils 14, 15, 16 are driven to generate the gradient waveforms depicted in FIG. 3, the image plane will be perpendicular whichever of the x-, y-, or z-axis gradient coils 14, 15, 16 is used to generate slice-select gradient 38.

Figure 3:
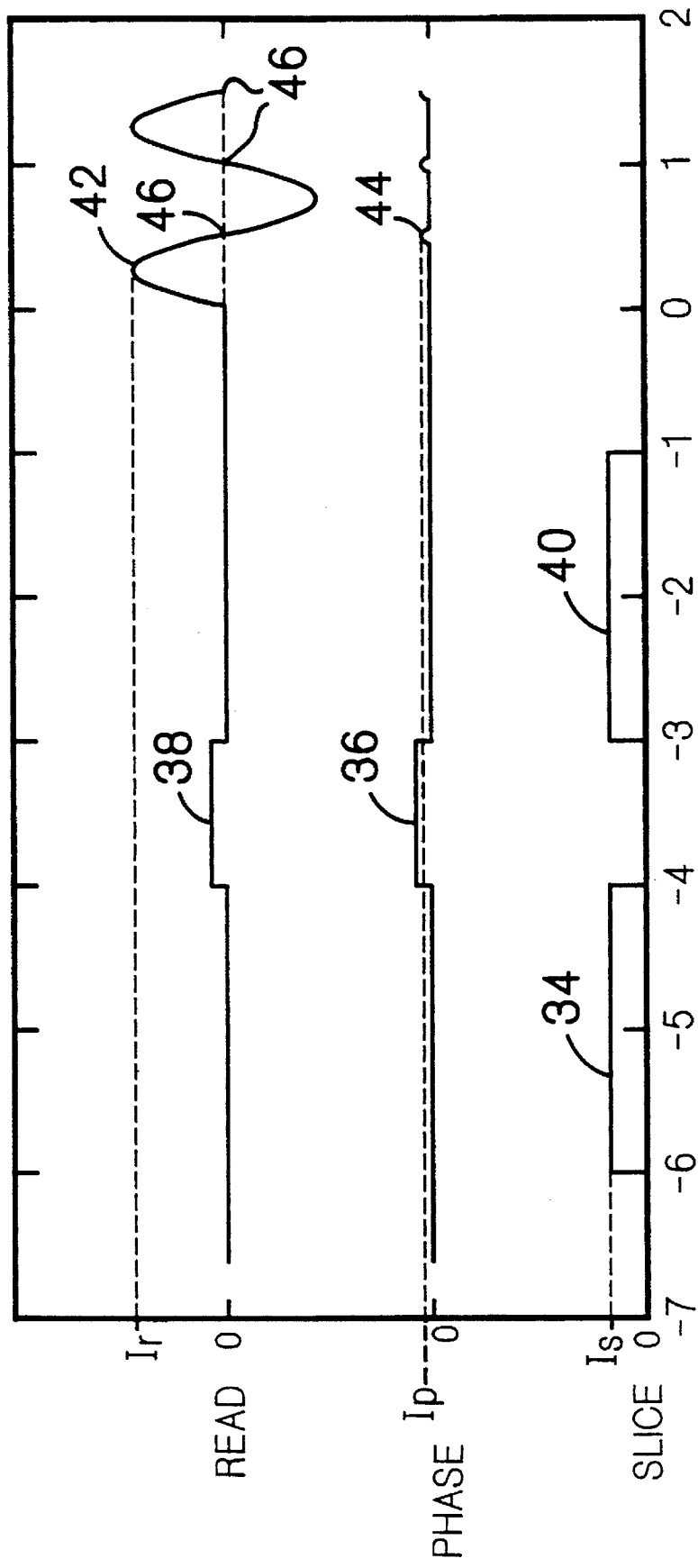
FIG. 3 is a timing diagram showing signals used in an echo planar imaging (EPI) MRI sequence.

In many situations, it is desirable to image an object, e.g., an organ such as a human heart, in which the cross-section of interest is not perpendicular to, and cannot conveniently be physically rotated to an orientation perpendicular to, the x, y, or z axes of coils 10. In such instances it is advantageous to rotate instead the image plane, as determined by the orthogonal read, phase, and slice directions, to the desired orientation. To accomplish this using EPI techniques, the read, phase, and slice gradient waveforms shown in FIG. 3 are generated in orthogonal read, phase, and slice directions that are rotated through at least one non-zero angle with respect to the x, y, and z gradient coil directions. Because of this rotation, each of the desired read, phase, and slice waveforms has components in at least one of the x, y, and z gradient coil directions. Thus, as described in greater detail below, the image plane can be rotated by driving gradient coils 14, 15, 16 to generate gradient waveforms that equal or approximate the sums of those components of the read, phase, and slice gradient waveforms that lie in the respective x, y, and z gradient coil directions.

The rotation of any orthogonal cartesian set of axes with respect to a given frame of reference can be described by three angles, $\theta$, $\phi$, and $\psi$. Known as Euler angles, $\theta$ and $\phi$ are the polar and azimuthal angles, respectively, and $\psi$ represents the rotational orientation of the image in the image plane. Thus, $\theta$ and $\phi$ determine the orientation of the slice plane with respect to the x, y, and z axes, and $\psi$ determines the orientation of the displayed MRI image of that slice plane.

For a given set of Euler angles, the rotation from the desired read, phase, and slice directions to the x, y, and z axes of coils 10 is described by the following relation:

$$\begin{bmatrix} I_x(t) \\ I_y(t) \\ I_z(t) \end{bmatrix} = \begin{bmatrix} a_{rx} a_{px} a_{sx} \\ a_{ry} a_{py} a_{sy} \\ a_{rz} a_{pz} a_{sz} \end{bmatrix} \begin{bmatrix} I_r(t) \\ I_p(t) \\ I_s(t) \end{bmatrix} \quad (3)$$

where:

$$\begin{bmatrix} a_{rx} a_{px} a_{sx} \\ a_{ry} a_{py} a_{sy} \\ a_{rz} a_{pz} a_{sz} \end{bmatrix} = \begin{bmatrix} (\cos\phi\cos\psi - \cos\theta\sin\phi\sin\psi) & (\sin\phi\cos\psi + \cos\theta\cos\phi\sin\psi) & \sin\theta\sin\psi \\ (-\cos\phi\sin\psi - \cos\theta\sin\phi\cos\psi) & (-\sin\theta\sin\psi + \cos\theta\cos\phi\cos\psi) & \sin\theta\cos\psi \\ \sin\theta\sin\phi & -\sin\theta\cos\phi & \cos\theta \end{bmatrix} \quad (4)$$

Thus, during the slice-select phase, when $I_r$ and $I_p$ both equal zero, slice-select gradient pulse 38 of amplitude $I_s$ is generated in the desired rotated slice direction when:

$$I_x = I_s a_{sx} \quad (5)$$

$$I_y = I_s a_{sy} \quad (6)$$

$$I_z = I_s a_{sz} \quad (7)$$

Pre-phasing gradient pulses 36, 38 and refocus pulse 40 are generated in the rotated directions in a similar manner.

During the acquisition sequence, when $I_s$ equals zero, the desired read-out and phase-coding gradients are generated in the desired rotated read and phase directions when:

$$I_i(t) = I_r a_{ri} \sin(\omega_r t), |t \bmod T_r| > T_p/2 \quad (8)$$

$$I_i(t) = I_r a_{ri} \sin(\omega_r t) + I_p a_{pi} \cos(\omega_p(t \bmod T_r)), |t \bmod T_r| < T_p/2 \quad (9)$$

where i represents axes x, y, and z.

Figure 4A:
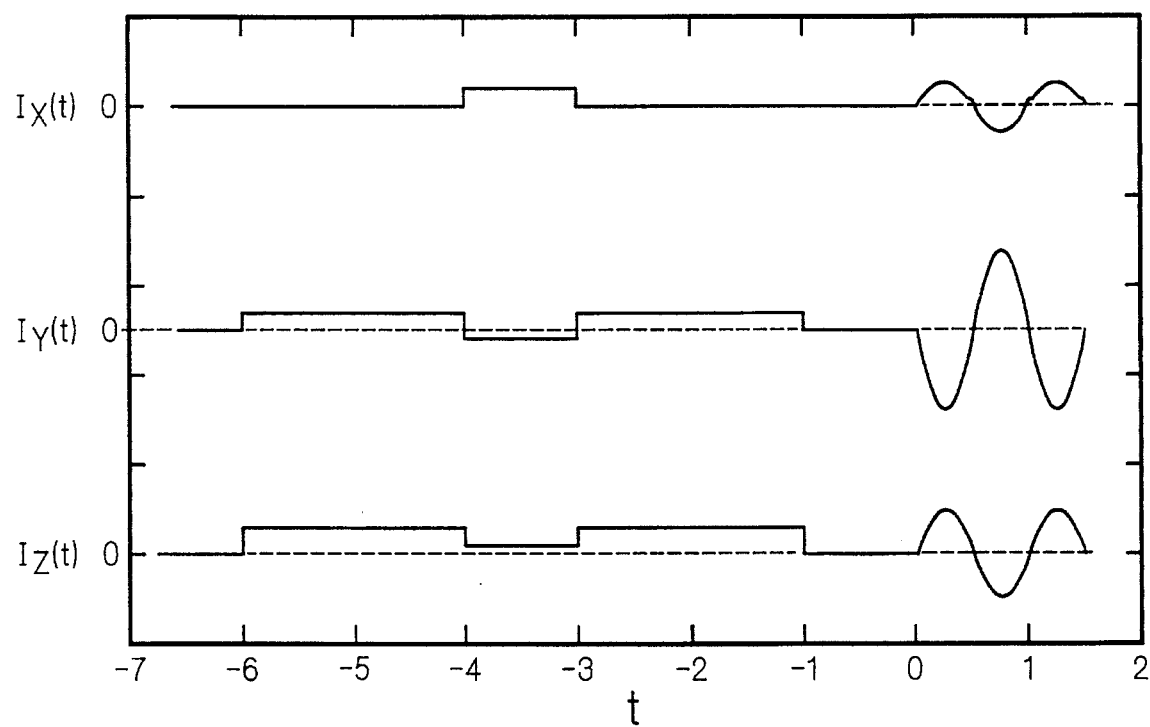
FIG. 4a is a timing diagram showing signals for generating the EPI signals of FIG. 3 in a rotated frame of reference.
Figure 4B:
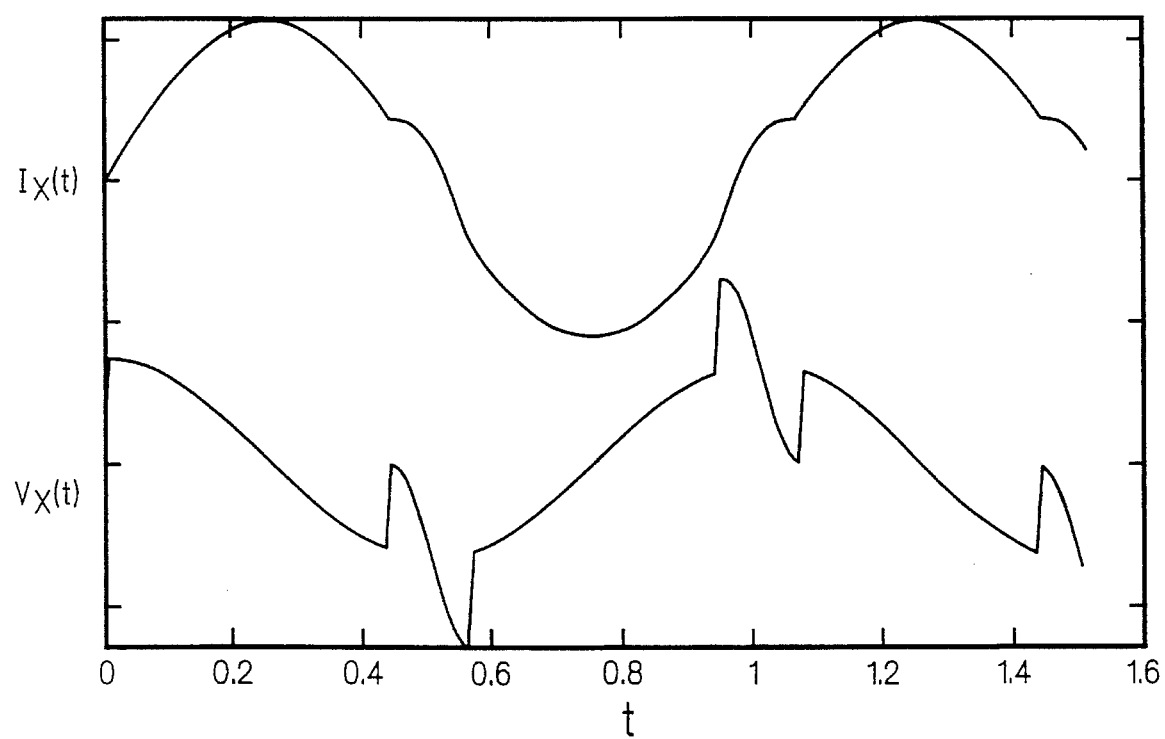

Thus, in order to generate the read, phase, and slice gradient waveforms shown in FIG. 3 in a desired rotated frame of reference, the desired angles of rotation $\theta$, $\phi$, and $\psi$ are substituted into equations (4), (8), and (9). For instance, in order to generate the EPI read, phase, and slice gradient waveforms in a frame of reference that is rotated through 30° and 75° with respect to the x, y, and z axes, the x, y, and z gradient coils 14, 15, 16 can be driven with the current signals $I_x(t)$, $I_y(t)$, and $I_z(t)$ shown in FIG. 4a. Current signal $I_x(t)$, together with its corresponding voltage signal $V_x(t)$, are shown in detail in FIG. 4b.

The pure sinusoidal portion of the desired waveform (i.e., the portion described by equation (8)) is generated, as described in greater detail below, using bridged capacitor network 24a. Capacitor 30a and coil 14 provide a circuit having a resonant frequency of $\omega_r$ when:

$$\omega_r = \frac{1}{\sqrt{LC_1}} \quad (10)$$

where L is the inductance of gradient coil 14 and $C_1$ is the capacitance of capacitor 30a. Because L and $\omega_r$ are generally given, capacitor 30a should thus be selected such that:

$$C_1 = L\omega_r^2 \quad (11)$$

The capacitors for the first bridged capacitor networks of the resonant power supplies of the other two gradient coils 15, 16 are likewise chosen to provide a circuit having a resonant frequency of $\omega_r$.

To avoid transients, prior to initiating a gradient waveform readout sequence, capacitor 30a is precharged to an initial voltage $V_{1i}$ equal to the peak capacitor voltage generated when gradient coil 14 resonates with the desired coil current $I_r a_{ri}$, as provided by equation (8). As described in U.S. Pat. No. 5,285,161 issued to Rzedzian et al.:

$$V_{1i} = I_r a_{ri} \sqrt{\frac{L}{C_1}} \quad (12)$$

The summed portion of the desired waveform (i.e., the portion described by equation (9)) can be approximated by a half-period phase-offset cosine segment having the same frequency $\omega_p$ as the phase blips of phase gradient 36. For the negative-going portion of the gradient waveform, this segment is described by:

$$I_i(t) = I_{2i} \cos(\omega_p(t \bmod T_r) + \eta_i), |t \bmod T_r| < T_p/2 \quad (13)$$

For the positive-going portion of the gradient waveform, the segment is described by:

$$I_i(t) = I_{2i} \cos(\omega_p(t \bmod T_r) - \eta_i), |t \bmod T_r| < T_p/2 \quad (14)$$

The phase-offset cosine segment of the desired generalized waveform is generated, as described in greater detail below, by employing bridged capacitor network 24b. The capacitance $C_2$ of capacitor 30b is chosen to provide the desired frequency $\omega_p$:

$$C_2 = L\omega_p^2 \qquad (15)$$

The capacitors for the second bridged capacitor networks of the resonant power supplies of the other two gradient coils 15, 16 are likewise chosen to provide a circuit having a resonant frequency of $\omega_p$.

The amplitude $I_{2i}$ of the phase-offset cosine segment should be such that the integral over this segment equals the integral over one segment of the summed portion of the desired waveform. Accordingly:

$$I_{2i} = I_p \frac{a_{pi}}{\cos \eta_i} \qquad (16)$$

Note that the integrals of the phase-offset cosine segments described by equations (13) and (14) are both positive.

The values of $I_r$ and $I_p$ are derived from imaging requirements:

$$I_r = \left[ \frac{\omega_r}{\gamma f f 2\Delta} \right] \qquad (17)$$

$$I_p = \left[ \frac{\omega_p}{\gamma f f 2 FOV} \right] \qquad (18)$$

Where $\gamma$ is the gyromagnetic ratio, ff is the strength of the gradient coil, $\Delta$ is the image resolution, and FOV is the field of view (here, in the phase direction).

The current waveform of coil 14 should be continuous everywhere, including at the point of transition between the pure sinusoidal portion and the phase-offset cosine segment. At this point $t_i$, which occurs $T_p/2$ before each zero-crossing 40, equation (8) thus equals equation (13):

$$I_p \frac{a_{pi}}{\cos \eta_i} \cos(\omega_p(t_i \bmod T_r) + \eta_i) = I_r a_{ri} \sin \omega_r t_i \qquad (19)$$

Noting that $t_i \bmod T_r$ equals $-T_p/2$, one-quarter of the period of phase blip 36, this expression can be rearranged to find $\eta_i$:

$$I_p a_{pi} \tan \eta_i = I_r a_{ri} \sin \omega_r t_i \qquad (20)$$

$$\eta_i = \tan^{-1} \left[ \frac{I_r a_{ri}}{I_p a_{pi}} \sin \omega_r t_i \right] \qquad (21)$$

Using $\eta_i$, the amplitude $I_{2i}$ of the half-period, phase-offset cosine segment can be determined from equation (16). These values, together with the relationship $$I = C \frac{dv}{dt} \qquad (22)$$

can then be used to calculate the initial precharge voltage $V_{2i}$ on capacitor 30b that provides the desired phase offset $\eta_i$:

$$V_{2i}(t_i) = \frac{I_{2i}}{C_2 \omega_p} \sin(\omega_p(t_i \bmod T_r) + \eta_i) \qquad (23)$$

Figure 5A:
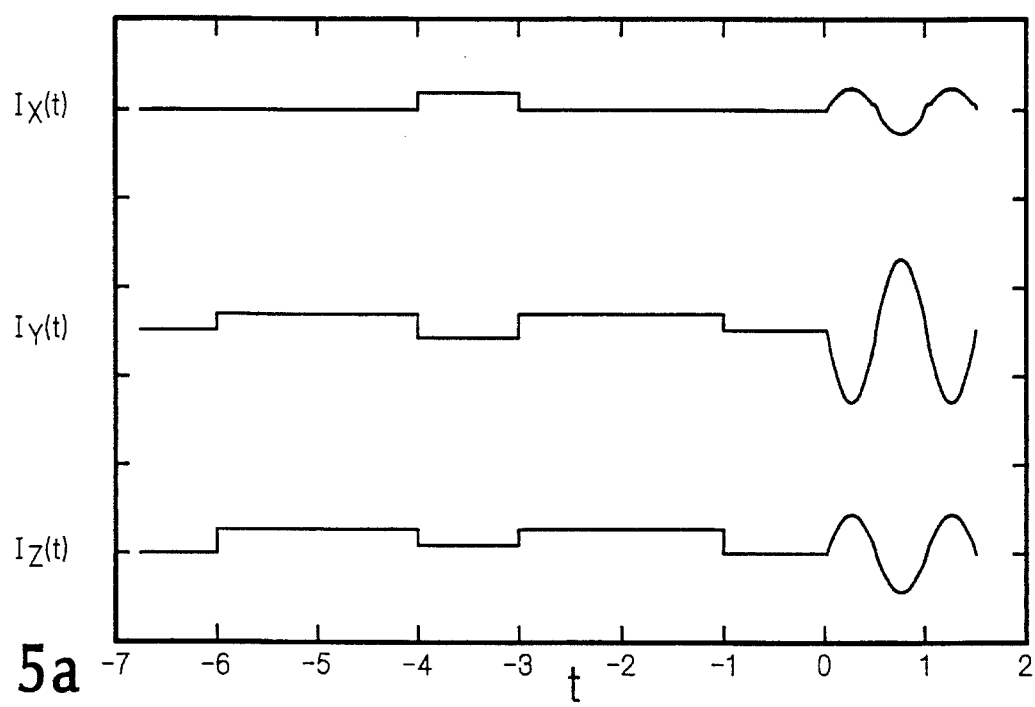
Figure 5B:
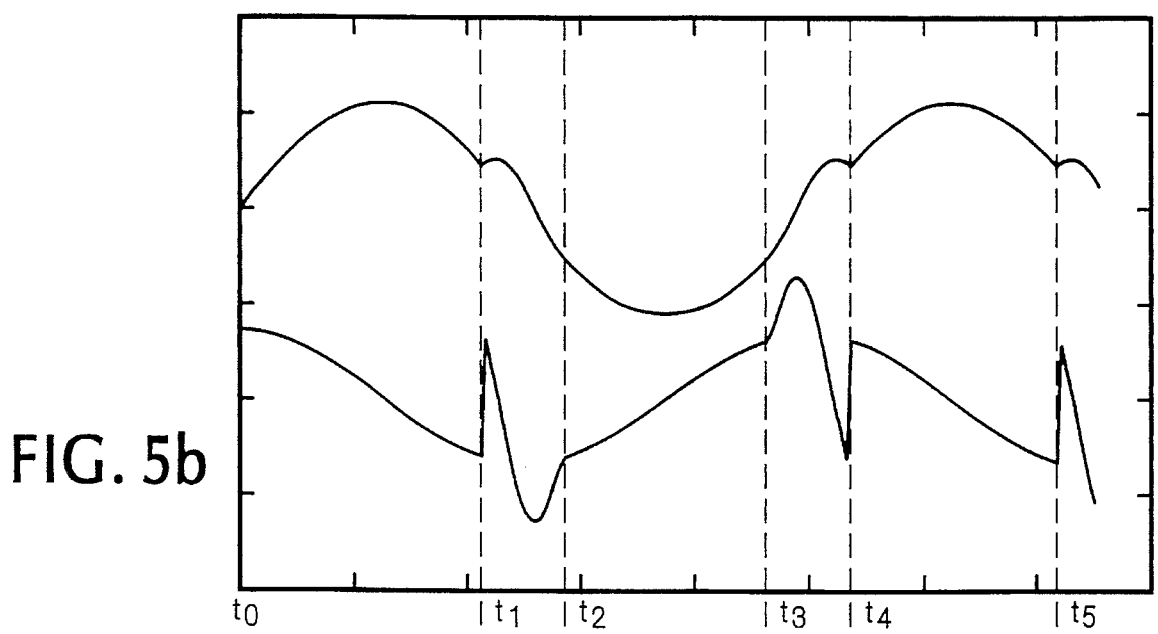

The current signals $I_x(t)$, $I_y(t)$, and $I_z(t)$ used to drive the x, y, and z gradient coils 14, 15, 16 in order to generate the EPI read, phase, and slice gradient waveforms shown in FIG. 3 in a frame of reference that is rotated through (for example) 30° and 75° with respect to the x, y, and z axes are shown in FIG. 5a. In short, based on imaging requirements, controller 33 determines the desired read, phase, and slice waveforms in the respective read, phase, and slice directions. From these desired waveforms, controller 33 performs the appropriate transforms to determine the precharge voltages on capacitors 30a, 30b, as well as the current waveform to be provided by amplifier 22. As shown in FIG. 5b and described below, controller 33 controls switches 26a, 26b, 26c, 26d; 28a, 28b, 28c, 28d to cause RPS 20 to generate gradient field waveforms that approximate the summed x, y, and z components of the desired read, phase, and slice waveforms.

The slice-select, pre-encode, and refocus pulses 34, 36, 38 are generated by driving gradient coils 14, 15, 16 directly with their respective gradient amplifiers to generate current pulses of the appropriate amplitude. Thus, for example, during the slice-select period, only switches 26a, 26b in RPS 20 are closed, and gradient amplifier 22 is controlled to supply the requisite current pulse of amplitude $I_s a_{sx}$, as provided by equation (5).

Current signal $I_x(t)$ from FIG. 5a, together with its corresponding voltage signal $V_x(t)$ and the switch control sequence for RPS 20, are shown in detail in FIG. 5b.

Prior to initiating the acquisition sequence, capacitors 30a, 30b are precharged to precharge voltages $V_{1i}$, $V_{2i}$. Once capacitors 30a, 30b have been charged, run/charge controller 33 initiates the acquisition sequence at $t_0$ by asserting control signals to close switches 26a, 26d (for the embodiment shown in FIG. 2b, controller 33 closes switch 26a). Capacitor 30a then begins to discharge into gradient coil 14, causing gradient coil 14 to generate a gradient waveform segment having frequency $\omega_r$.

Gradient amplifier 22, which is synchronized to the phase and frequency of the gradient waveform by controller 33, e.g., by monitoring the current of coil 14 and comparing the sensed current to the stored representative waveform determined by controller 33, provides energy to the resonant system in the form of voltage to compensate for resistive and other parasitic losses in RPS 20.

At time $t_1$, which occurs $T_p/2$ before the first zero crossing 46 of the read-out gradient waveform, controller 33 opens switches 26a, 26d, and substantially simultaneously closes switches 28a, 28d. Capacitor 30b then begins to discharge into gradient coil 14, causing gradient coil 14 to generate a gradient waveform having frequency $\omega_p$. Because of precharge voltage $V_{2i}$, the ensuing segment of the gradient waveform is a cosine of amplitude $I_{2i}$ having a phase-offset $\eta_i$. Because this is the negative-going portion of the gradient waveform, this phase-shifted cosine is described mathematically by equation (13).

At time $t_2$, which occurs $T_p/2$ after the first zero crossing 46 of the read-out gradient waveform, controller 33 opens switches 28a, 28d, and substantially simultaneously closes switches 26a, 26d. Capacitor 30a, the voltage on which has remained essentially constant since $t_1$, then begins to discharge into gradient coil 14, causing gradient coil 14 to generate another gradient waveform segment having frequency of $\omega_r$.

At time $t_3$, which occurs $T_p/2$ before the next zero crossing 46 of the read-out gradient waveform, controller 33 opens switches 26a, 26d and substantially simultaneously closes switches 28b, 28c. The polarity of capacitor 30b, the voltage on which has remained essentially constant since $t_2$, is thus reversed in RPS 20 relative to its polarity from $t_1$ to $t_2$. Gradient coil 14 again generates a gradient waveform segment having frequency $\omega_p$. Because this is the positive-going portion of the gradient waveform, the ensuing phase-shifted cosine is described mathematically by equation (14).

At time $t_4$, which occurs $T_p/2$ after the next zero crossing 46 of the read-out gradient waveform, controller 33 opens switches 28b, 28c, and substantially simultaneously closes switches 26a, 26d. Capacitor 30a, the voltage on which has remained essentially constant since $t_3$, then begins to discharge into gradient coil 14, causing gradient coil 14 to generate another gradient waveform segment having a frequency of $\omega_r$.

This continues until time $t_5$, which occurs $T_p/2$ before the next zero crossing 46 of the read-out gradient waveform. At $t_5$, the cycle described above starting at time $t_1$ repeats. Thus, the portion between $t_1$ and $t_5$ represents one period of the gradient waveform. The duration of this period is $2T_r$. Because the integrals of the phase-shifted cosine segments of each period of the waveform are both positive, the integral over one period of the waveform is positive.

Figure 5C:
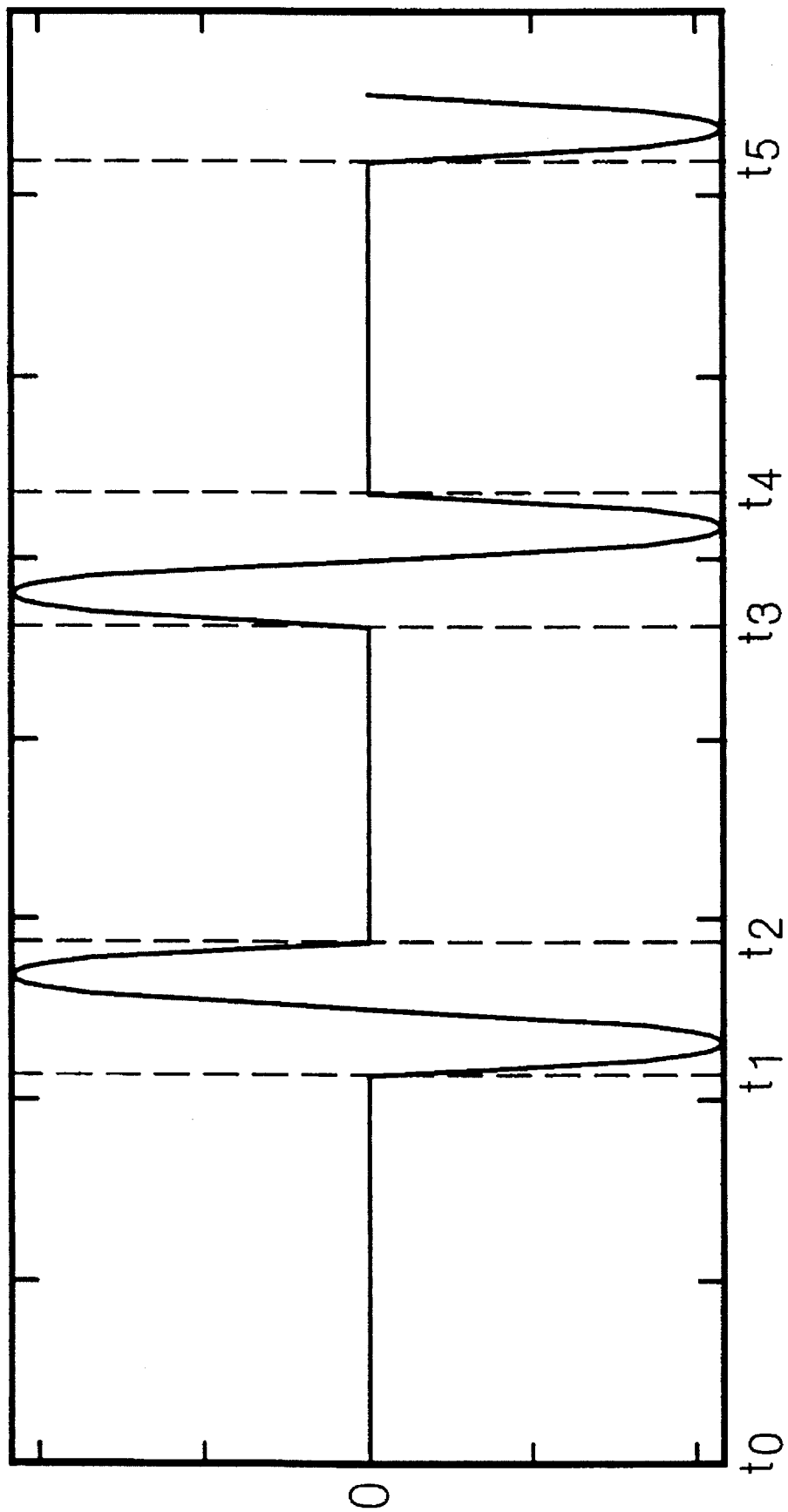
FIG. 5c is a detail view showing the difference between the current signal shown in FIG. 5b and the current signal shown in FIG. 4b.

As noted, RPS 20 is controlled to approximate the summed portion of the desired waveform (i.e., the portion described by equation (9)) with a half-period phase-offset cosine segment having the same frequency $\omega_p$ as the phase blips of phase gradient 36. The effect of this approximation is demonstrated in FIG. 5c, which shows the difference between the "approximate" x-coil current signal $I_x(t)$ of FIG. 5b and the "ideal" x-coil current signal $I_x(t)$ of FIG. 4b.

Figure 6A:
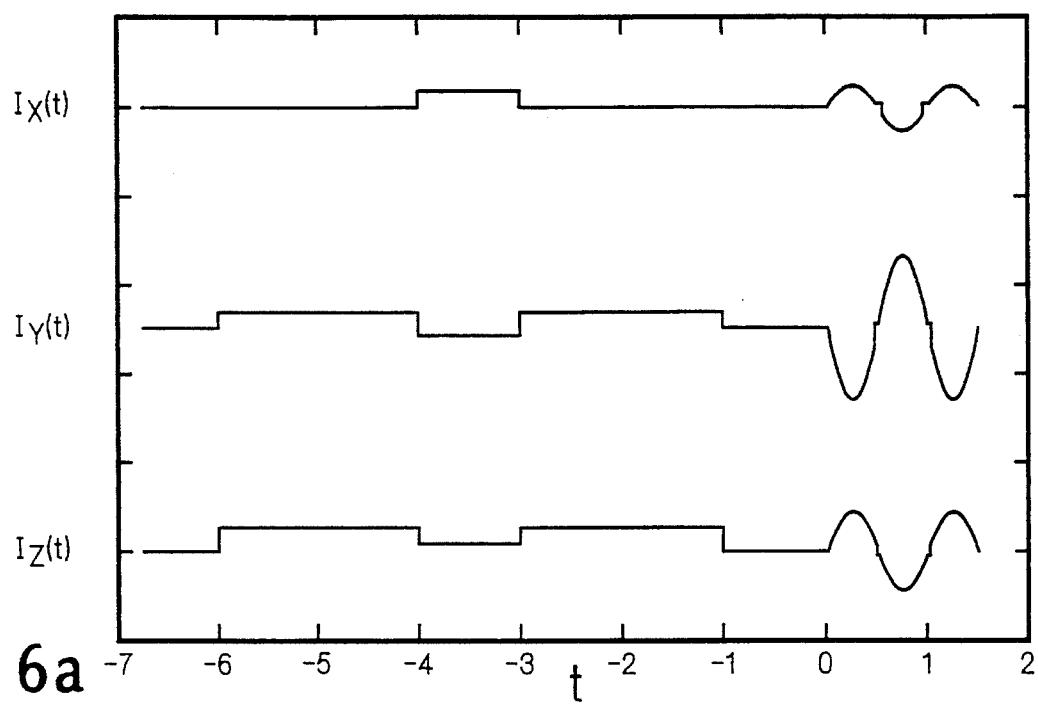

Other current signals $I_x(t)$, $I_y(t)$, and $I_z(t)$ for approximating the read, phase, and slice gradient waveforms shown in FIG. 3 in a frame of reference that is rotated through, for example, 30° and 75° with respect to the x, y, and z axes are shown in FIG. 6a. Current signal $I_x(t)$, together with its corresponding voltage signal $V_x(t)$, are shown in detail in FIG. 6b.

Figure 6B:
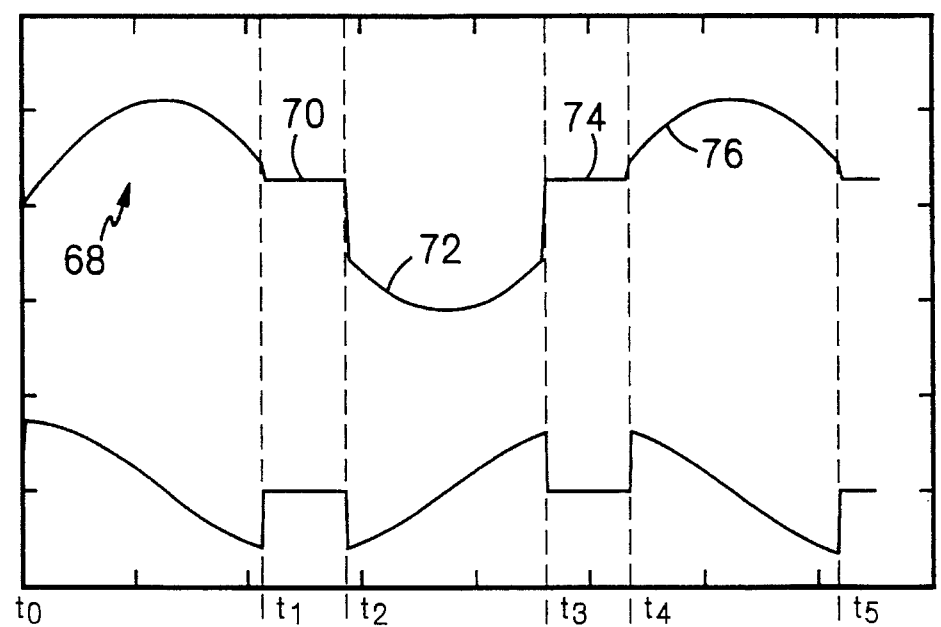

Referring to FIG. 6b, a single period of a waveform 68 starting at $t_1$ includes a positive constant-current (and thus also constant-gradient) segment 70 of duration $T_h$ (i.e., $t_2$ minus $t_1$), followed at $t_2$ by a sinusoidal segment 72 of frequency $\omega_r$, followed at $t_3$ by a positive horizontal, constant-current segment 74 (i.e., a sinusoidal segment with a frequency equal to zero) of duration $T_h$, followed at $t_4$ by a sinusoidal segment 76 of frequency $\omega_r$. At $t_5$, when segment 76 concludes, the waveform repeats. The amplitude of segments 72, 76 is $I_r a_{ri}$, and the amplitude $I_{2i}$ of segments 62, 66 is chosen such that the integral of waveform 68 over each of these segments equals the integral over one segment of the summed portion of the desired waveform, as provided by equation (9):

$$I_{2i} = \frac{2I_p a_{pi}}{T_h \omega_p} \quad (24)$$

The precharge voltage $V_{1i}$ on capacitor 30a is given by equation (12). As capacitor 30b is not needed to generate waveform 68, it is not precharged.

RPS 20 is controlled to generate current signal $I_x(t)$, and RPSs 21 and 23 are controlled in a similar manner to generate current signals $I_y(t)$ and $I_z(t)$, respectively. The control sequence to generate waveform 68 is shown in FIG. 6b. Once capacitor 30a has been charged, run/charge controller 33 initiates the acquisition sequence at $t_0$ by asserting control signals to close switches 26a, 26d. Capacitor 30a then begins to discharge into gradient coil 14, causing gradient coil 14 to generate a segment 78 of gradient waveform 68 having a frequency of $\omega_r$. On the negative-going portion of segment 78, when (at time $t_1$) the current of coil 14 equals $I_{2i}$, as provided by equation (24), controller 33 opens switches 26a, 26d, and substantially simultaneously closes switches 28a, 28b. Gradient amplifier 22 is then controlled to supply $I_{2i}$ for a duration of $T_p$ (until time $t_2$).

At time $t_2$, controller 33 opens switches 28a, 28b, and substantially simultaneously closes switches 26a, 26d, allowing capacitor 30a, the voltage on which has remained essentially constant since $t_1$, to resume discharging into gradient coil 14, causing gradient coil 14 to generate segment 72 of gradient waveform 68. On the positive-going portion of segment 72, when (at time $t_3$) the current of coil 14 equals $I_{2i}$, controller 33 opens switches 26a, 26d, and substantially simultaneously closes switches 28a, 28b. Gradient amplifier 22 is again controlled to supply $I_{2i}$ for a duration of $T_p$ (until time $t_4$). Segment 76, which concludes at time $t_5$, is provided in a manner similar to segment 78.

The portion between $t_1$ and $t_5$ represents one period of gradient waveform 68. Because the integrals of positive horizontal segments 70, 74 of waveform 68 are positive, the integral over one period of waveform 68 is positive.

The waveform segments between $t_1$ and $t_2$ and $t_3$ and $t_4$ need not be horizontal segments 70, 74. Rather, amplifier 22 may be controlled during these time periods to generate a variety of different waveform segment shapes (e.g., lines of constant, nonzero slope). At least three factors should be considered when selecting these waveform segments. First, the amplitude and the frequency or frequencies of the waveform should be within the bandwidth of amplifier 22. Because amplifier 22 drives coil 14 directly during these segments, the frequency of the waveform need not be determined with reference to the resonant frequencies of RPS 20. Second, to provide a continuous current waveform, the waveform segments should be continuous with adjacent sinusoidal waveform segments 72, 76, 78. Third, the waveform segments should be chosen so that the integral over each segment equals the integral over the same time period of the summed portion of the desired waveform, as provided by equation (9).

Figure 7:
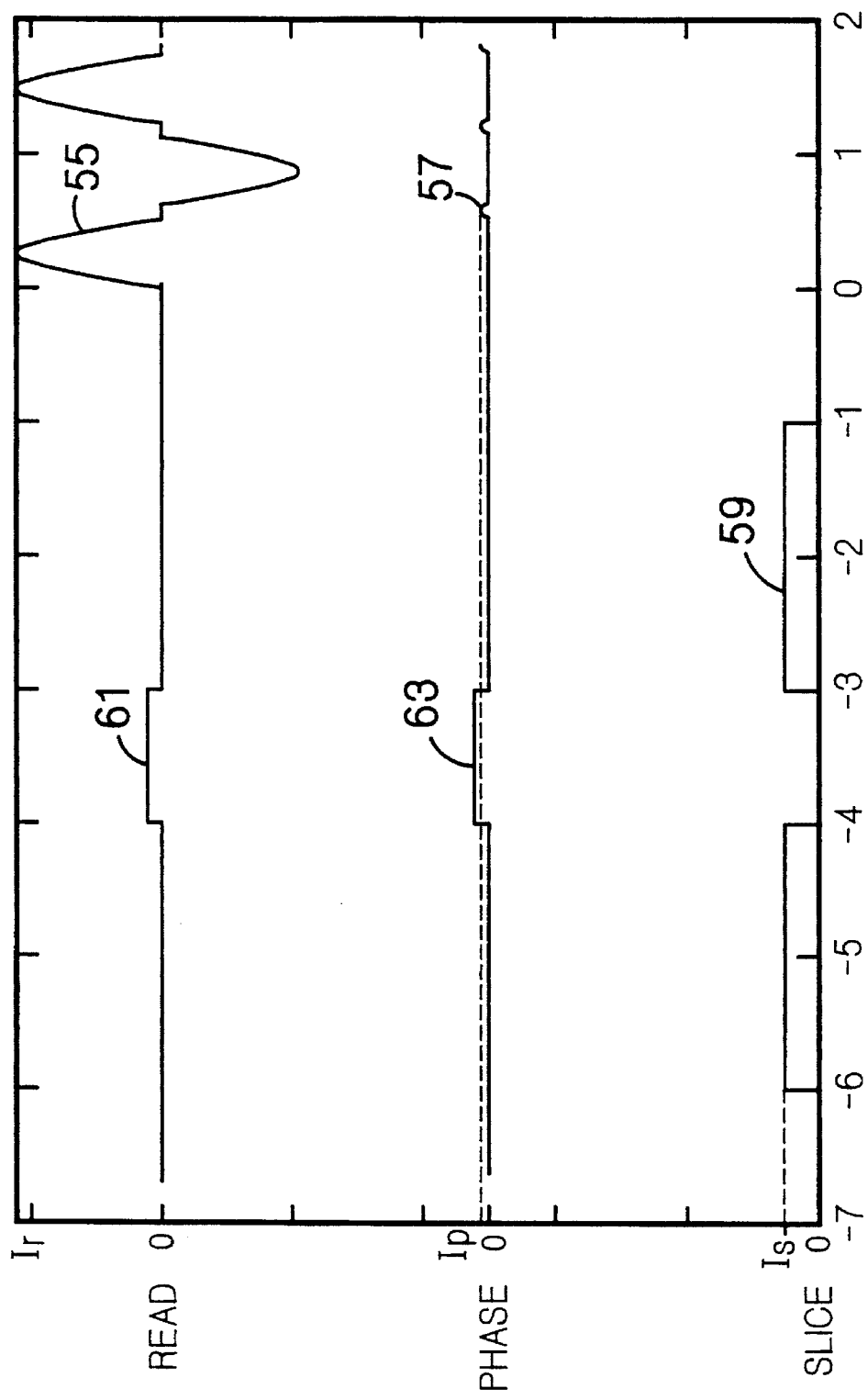
FIG. 7 is a timing diagram showing signals used in another EPI MRI sequence.

An alternate EPI sequence is shown in FIG. 7. This sequence is similar to that shown in FIG. 3 (having a read-out gradient waveform 55, a phase-coding gradient waveform 57, and a slice-select gradient waveform 59 of amplitudes $I_r$, $I_p$, and $I_s$, respectively), except read-out gradient waveform 55 is equal to zero when phase-coding gradient waveform 57 is nonzero. Accordingly, with the exception of prephasing gradient pulses 61, 63, when any one gradient waveform is nonzero, the other two gradient waveforms are zero.

Figure 8A:
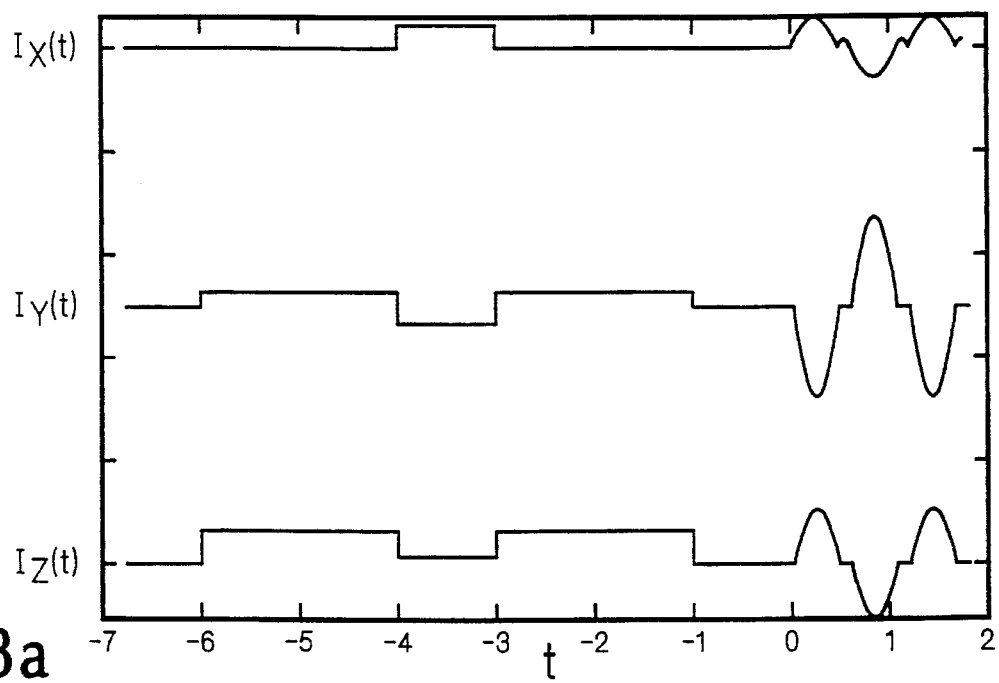

In order to generate the EPI read, phase, and slice gradient waveforms shown in FIG. 7 in a frame of reference that is rotated, for example, through 30° and 75° with respect to the x, y, and z axes, the x, y, and z gradient coils 14, 15, 16 can be driven with the current signals $I_x(t)$, $I_y(t)$, and $I_z(t)$ shown in FIG. 8a. Current signal $I_x(t)$, together with its corresponding voltage signal $V_x(t)$, are shown in detail in FIG. 8b.

Figure 8B:
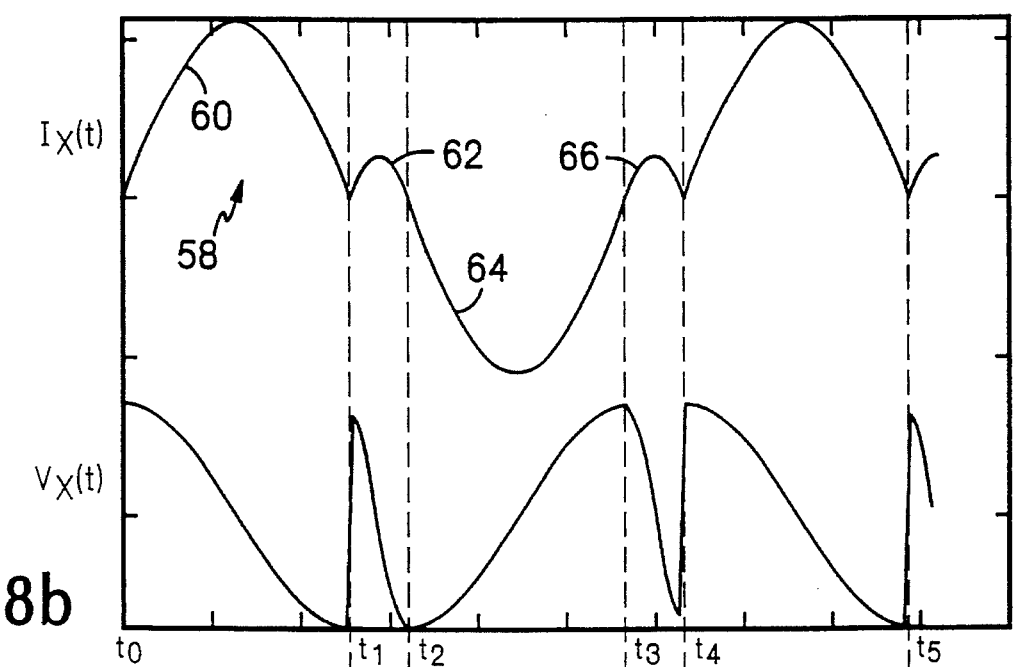

Referring to FIG. 8b, a single period 58 of current signal $I_x(t)$ starting at $t_0$ includes a positive, half-period sinusoidal segment 60 of frequency $\omega_r$, followed at $t_1$ by a positive, half-period sinusoidal segment 62 of frequency $\omega_p$, followed at $t_2$ by a negative, half-period sinusoidal segment 64 of frequency $\omega_r$, followed at $t_3$ by a positive, half-period sinusoidal segment 66 of frequency $\omega_p$. At $t_4$, when segment 66 concludes, the waveform repeats. The amplitude of segments 60, 64 is $I_r a_{ri}$, as provided by equation (8), and the amplitude of segments 62, 66 is $I_p a_{pi}$, as provided by equation (16), where $\eta_i$ equals zero. Thus, segments 60, 64 are scaled to provide (together with the waveforms on the other two axes) read-out gradient 55 of amplitude $I_r$ in the desired rotated orientation. Similarly, segments 62, 66 are scaled to provide (together with the waveforms on the other two axes) phase-coding gradient 57 of amplitude $I_s$ in the desired rotated orientation. The precharge voltage $V_{1i}$ on capacitor 30a is given by equation (12). Similarly, the precharge voltage $V_{2i}$ on capacitor 30b is:

$$V_{2i} = I_p a_{pi} \sqrt{\frac{L}{C_2}} \quad (25)$$

RPS 20 is controlled to generate current signal $I_x(t)$, and RPSs 21 and 23 are controlled in a similar manner to generate current signals $I_y(t)$ and $I_z(t)$, respectively. The control sequence used to generate waveform 58 is identical to that used to generate the waveform in FIG. 5b. The portion between $t_0$ and $t_4$ represents one period of gradient waveform 58. Note that for the same values of $\omega_r$ and $\omega_p$, a single period of the waveform is longer, by $2T_p$, than the waveform. Because the integrals of segments 62, 66 of waveform 58 are positive, the integral over one period of waveform 58 is positive.

Figure 9A:
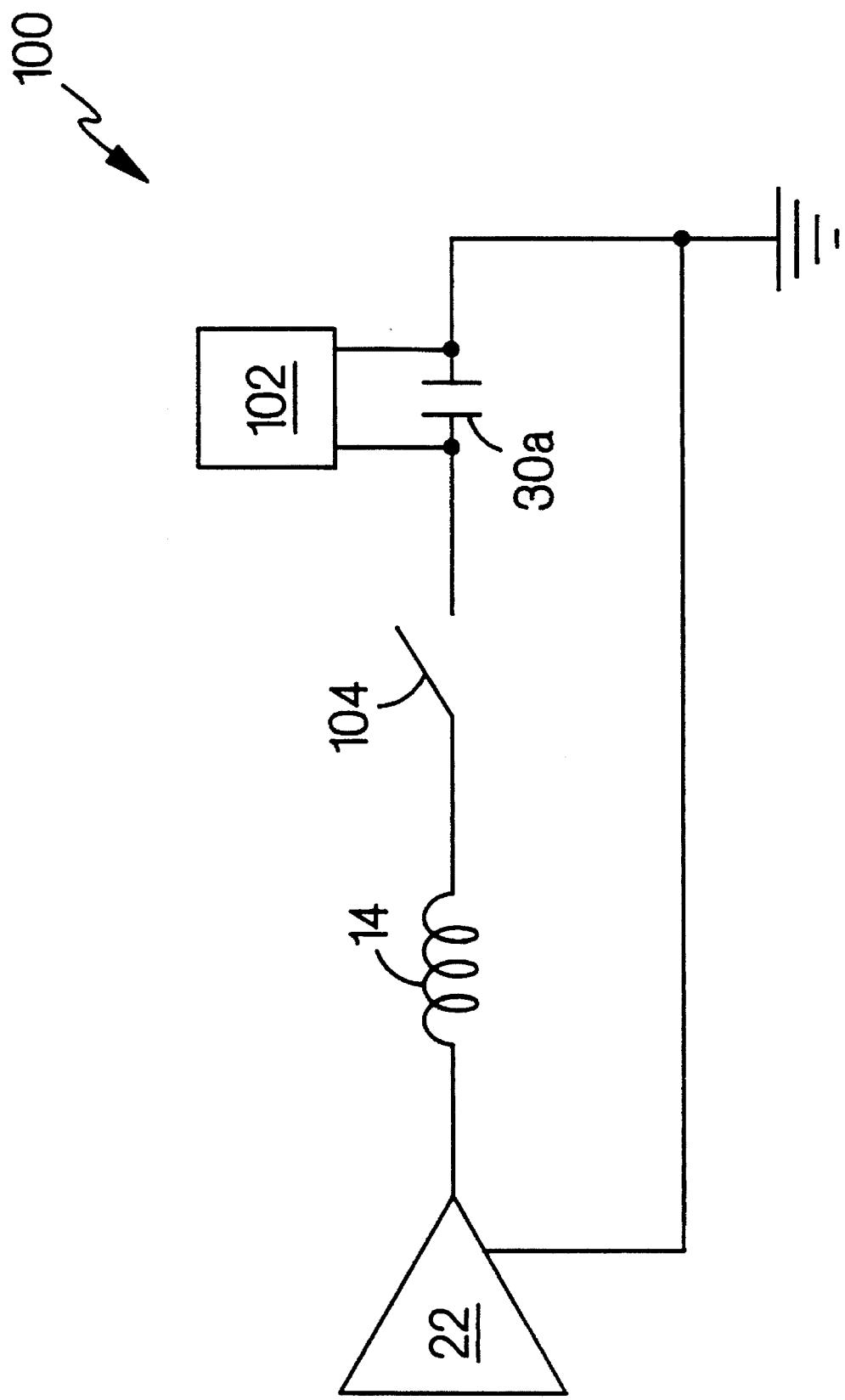
FIG. 9a is a simplified block diagram helpful for understanding another embodiment of the invention.

Another topology for an RPS 100 for driving gradient coils 14 to provide waveform components of desired waveforms in rotated read, phase, and slice directions is shown in FIG. 9a. Amplifier 22, gradient coil 14, switch 104, and capacitor 30a are all connected in series (the controlling circuitry and the associated control lines are not shown in FIG. 9a). Current source 102, which supplies a constant current $I_B$, is connected in parallel with capacitor 30a. A charging circuit and a controller (not shown) are provided as described in connection with FIGS. 2a and 2b.

Figure 10A:
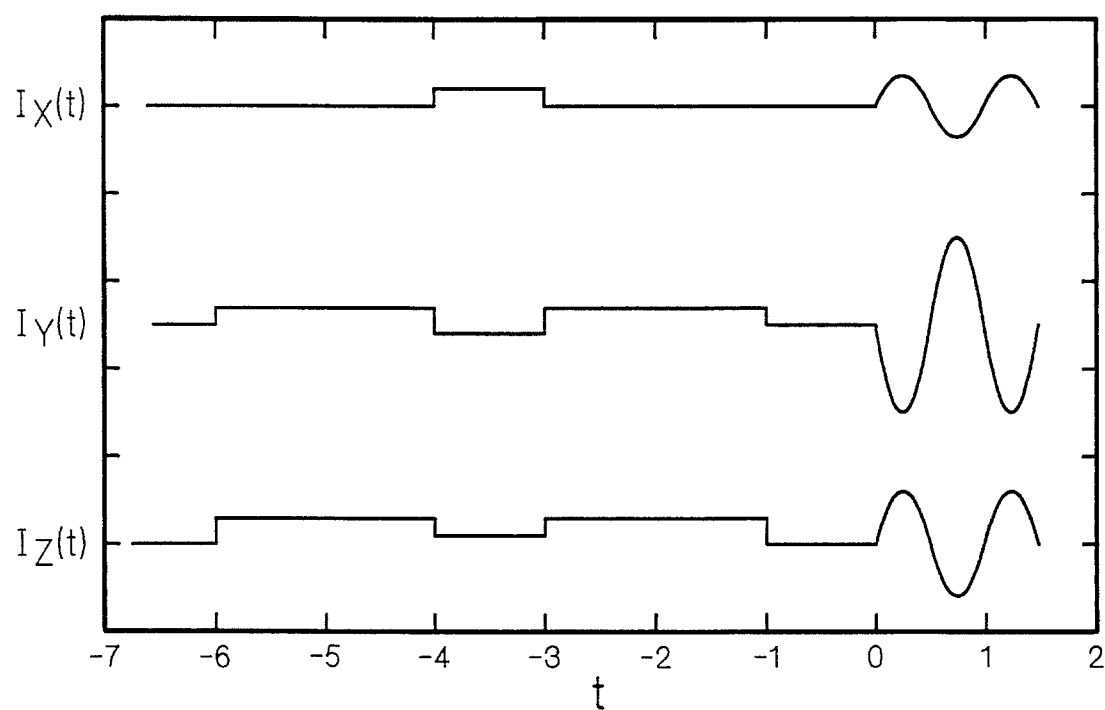

Current signals $I_x(t)$, $I_y(t)$, and $I_z(t)$ for approximating the read, phase, and slice gradient waveforms shown in FIG. 3 in a frame of reference that is rotated through, for example, 30° and 75° with respect to the x, y, and z axes are shown in FIG. 10a. Current signal $I_x(t)$ 120 generated by RPS 100, together with its corresponding voltage signal $V_x(t)$, are shown in detail in FIG. 10b. Current signals $I_y(t)$ and $I_z(t)$ are generated by respective power supplies (not shown) that are substantially identical to RPS 100.

Figure 10B:
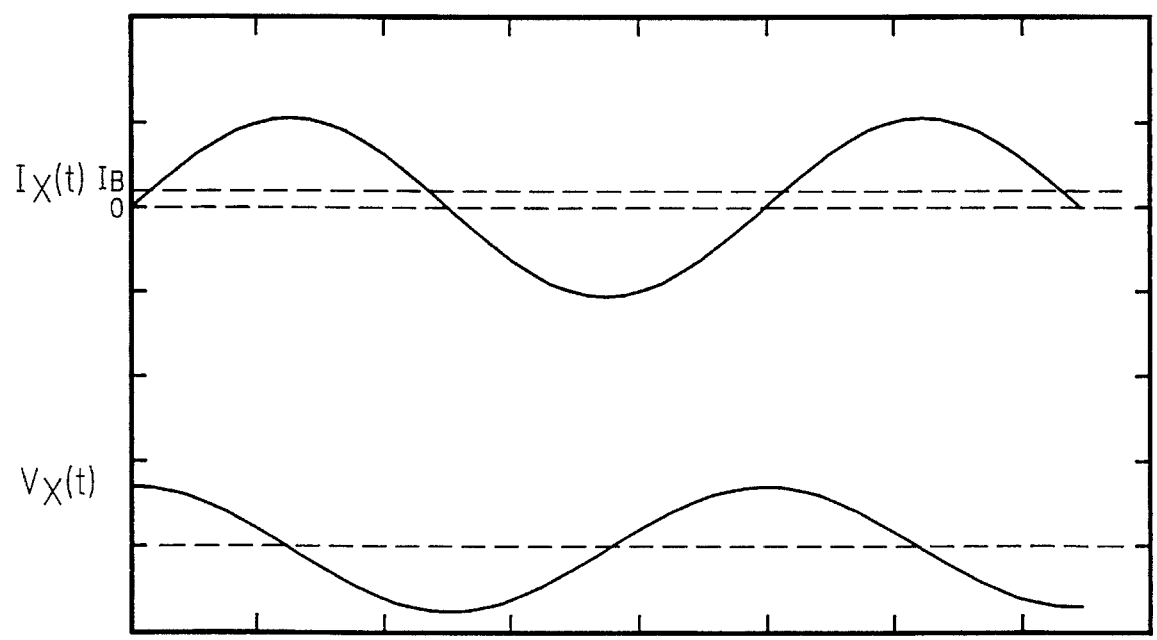

Although difficult to see in FIG. 10b, waveform 120, which has a frequency of $\omega_r$, is positively DC-offset by an amount $I_B$ (and accordingly, the magnitude of voltage signal $V_x(t)$ increases throughout the EPI sequence). The value of $I_B$ is chosen such that the integral over one period of waveform 120 equals the integral, over one period of read-out gradient waveform 42, of phase-coding gradient waveform 44. Thus:

$$I_B = \frac{2\omega_r I_p a_{pi}}{\pi \omega_p} \tag{26}$$

The precharge voltage $V_{1i}$ on capacitor 30a is as given above by equation (12). Once capacitor 30a has been charged, the run/charge controller initiates the acquisition sequence at $t_0$ by asserting control signals to close switch 104. Note that the integral over one period of waveform 120 is positive.

Figure 9B:
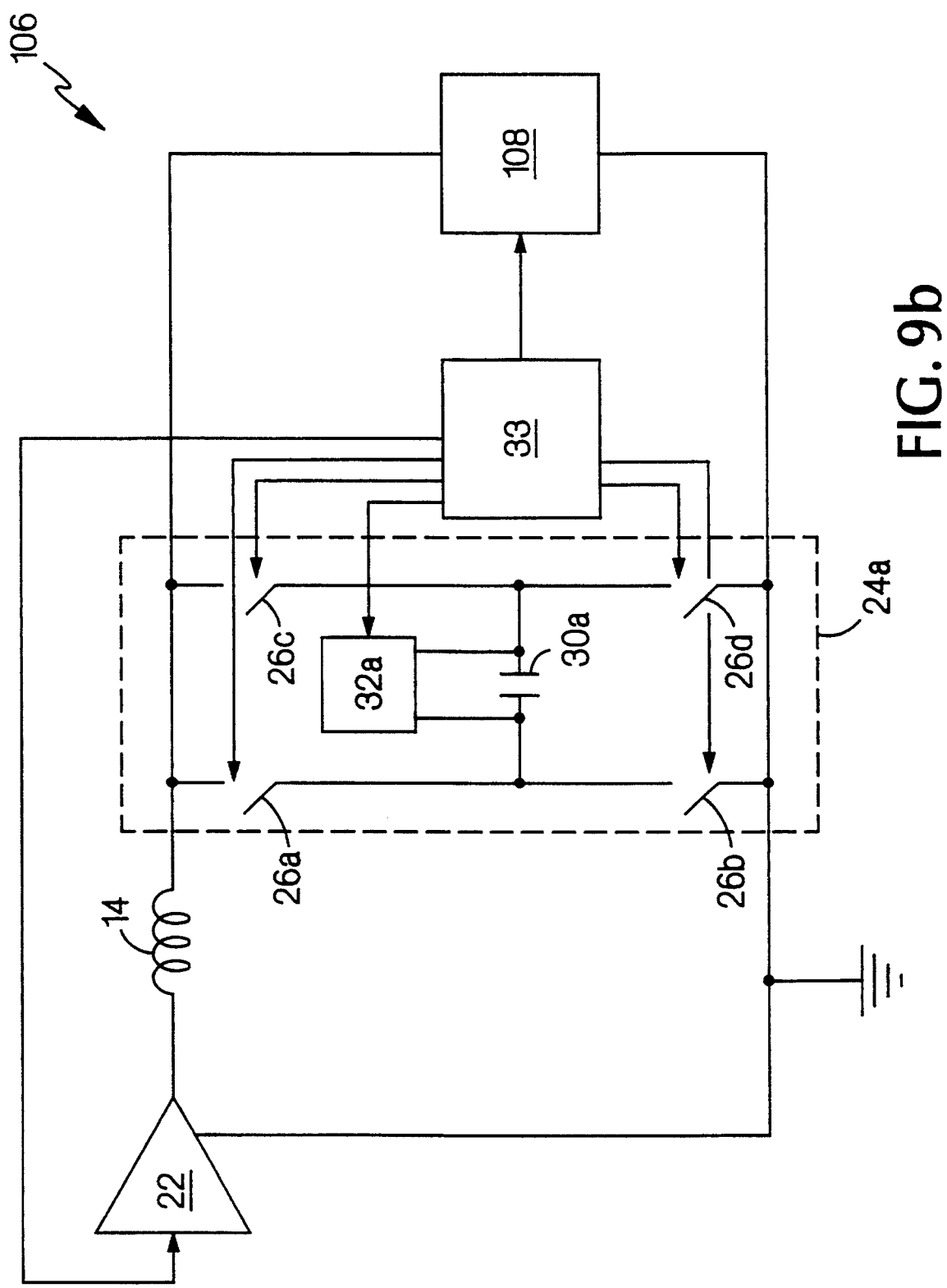
FIG. 9b is a simplified block diagram helpful for understanding another embodiment of the invention.

An alternate topology for generating waveforms of the type depicted in FIGS. 10a and 10b is shown in FIG. 9b. RPS 106 is similar to RPS 20 shown in FIG. 2a, except a current source 108 for supplying a constant current $I_B$ has been substituted for bridged capacitor network 24b.

Figure 11:
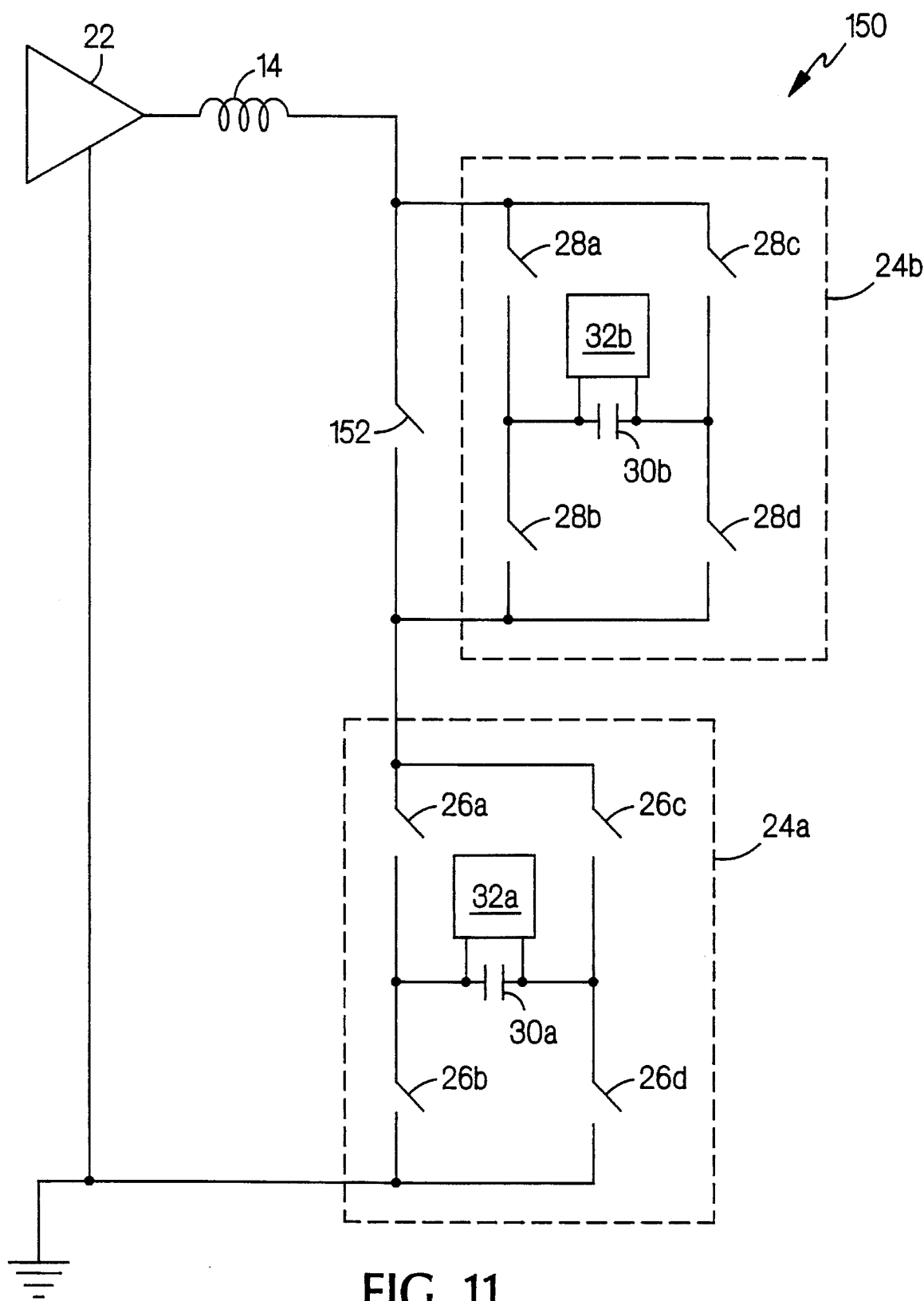
FIG. 11 is a simplified block diagram helpful for understanding another embodiment of the invention.

Another topology for an RPS 150 for driving gradient coils 14 to provide waveform components of the desired waveforms in rotated read, phase, and slice directions is shown in FIG. 11 (the controlling circuitry and the associated control lines are not shown in FIG. 11). RPS 150 is similar in construction to RPS 20 shown in FIG. 2a, except bridged capacitor networks 24a, 24b are connected in series in RPS 150, and switch 152 is connected in parallel with switches 28a, 28b. The operation of RPS 150 is also similar to that of RPS 20. The precharge voltage $V_{1i}$ on capacitor 30a provided by charger 32a is as given above by equation (12). The pure sinusoidal portion of the desired waveform (i.e., the portion described by equation (8)) is then generated by closing only switches 26a, 26b, 152, and synchronizing amplifier 22 to the current passing through coil 14.

An approximation of the summed portion of the desired waveform (i.e., the portion described by equation (8)) is then generated by opening switch 152 and closing switches 28a, 28d. This connects capacitors 30a, 30b in series with coil 14 and amplifier 22. The effective capacitance $C_e$ of this resonant circuit is:

$$C_e = \frac{C_2}{C_1 + C_2} \tag{27}$$

The capacitance $C_1$ of capacitor 30a is selected in accordance with equation (11). The desired effective capacitance $C_e$ (and thus also the capacitance $C_2$ of capacitor 30b) is then found by:

$$C_e = L\omega_r^2 \tag{28}$$

The desired phase offset is provided when capacitor 30b is precharged, by charger 32b, to a precharge voltage $V_{2i}$:

$$V_{2i}(t_i) = \frac{I_{2i}}{C_e \omega_p} \sin(\omega_p(t_i \bmod T_r) + \eta_i) \tag{29}$$

Because capacitor 30a remains in the current flow path to generate the approximation segment, at the conclusion of the segment the charge on the capacitor is not equal to the charge immediately preceding the beginning of the segment. This charge difference can be accommodated through appropriate control of the linear amplifier, charging circuit 32a, or a dedicated charge-correction circuit (comprising, e.g., an additional charged capacitor, not shown, that can be electrically connected in parallel with capacitor 30a at the conclusion of the approximation segment).

Although in the above-described embodiments the three x, y, and z gradient coils 14, 15, 16 are all driven using RPSs 20, 100, 150 or the like, acceptable performance may be realized where only two of the three gradient coils are driven using RPSs 20, 100, 150.

In one example of such an embodiment, the x- and y-axis gradient coils are driven using RPSs 20, 100, 150 or the like, and the z-axis gradient coil is driven directly by a gradient amplifier (not shown). Note-from equation (4) that if $\psi$ is restricted to zero degrees, which constrains the rotation of the displayed MRI image, $a_{rz}$ also equals zero. Thus, the z-axis gradient coil provides no component of read-out gradient 42 when $\psi=0$. During the acquisition period, the z-axis gradient coil provides only a component ($I_p a_{pz}$) of phase-coding gradient 44. Because phase-coding gradient 44 generally has a much smaller amplitude ($I_p$) than read-out gradient 42, this component can be generated by driving the z-axis gradient coil directly with its associated gradient amplifier.

If instead the y- and z-axis gradient coils are driven using RPSs 20, 100, 150 or the like, and the x-axis gradient coil is driven directly by a gradient amplifier (not shown), the x-axis gradient coil provides no component of read-out gradient 42 when:

$$\tan\psi = \frac{\cot\phi}{\cos\theta} \tag{30}$$

And if the y-axis gradient coil is the one that is driven directly by a gradient amplifier (not shown), that gradient coil provides no component of read-out gradient 42 when:

$$\tan\psi = -\frac{\tan\phi}{\cos\theta} \tag{31}$$

Thus, with only some loss of flexibility, these alternate embodiments allow the image plane to be rotated to an orientation that is not orthogonal to any of the x, y, or z axes.

Other embodiments are within the following claims.

For instance, the phase blip need not be centered around the zero-crossing of the read out gradient waveform, and need not be a cosine (i.e., a phase-shifted sinusoid). And, as disclosed in Rzedzian U.S. Pat. Nos. 4,628,264 and 5,285,161, the read out gradient waveform can be other than a regular sinusoid, e.g., the read out waveform may be comprised of a series of sinusoidal segments interconnected by horizontal segments. Furthermore, the approximated portion of the summed waveform can be any linear segment (e.g., a straight line at any angle), instead of just a horizontal segment. Thus, the approximation of the summed components of the read and phase gradient waveforms can be either a sinusoidal or a linear segment.

Moreover, although in each of the above-described embodiments the capacitors are connected in series with the gradient coil, they could instead be connected in parallel. And instead of using multiple capacitors to generate different segments of the gradient waveform, the gradient coil could be connected to a capacitor and another inductive coil. The second coil could be switched into and out of the circuit as necessary to generate the desired segments.

What is claimed is:

1. A method of generating magnetic field waveforms to approximate a desired set of read and phase gradient waveforms in respective orthogonal read and phase directions for echo planar magnetic resonance imaging, said method comprising the steps of:

providing a first gradient coil for generating a magnetic field gradient in a first one of three orthogonal gradient coil directions;

said gradient coil directions rotated with respect to said read and phase directions so that said desired read and phase gradient waveforms have simultaneous non-zero components in said first one of said gradient coil directions;

driving said first gradient coil to generate a first gradient waveform having a first segment that approximates the sum of said simultaneous non-zero components of said read and phase gradient waveforms in said first one of said gradient coil directions, said first segment being either a sinusoidal segment or a linear segment.

2. Apparatus for generating magnetic field waveforms to approximate a desired set of read and phase gradient waveforms in respective orthogonal read and phase directions for echo planar magnetic resonance imaging, said apparatus comprising:

a first gradient coil for generating a magnetic field gradient in a first one of three orthogonal gradient coil directions;

said gradient coil directions rotated with respect to said read and phase directions so that said desired read and phase gradient waveforms have simultaneous non-zero components in said first one of said gradient coil directions;

means for driving said first gradient coil to generate a first gradient waveform having a first segment that approximates the sum of said simultaneous non-zero components of said read and phase gradient waveforms in said first one of said gradient coil directions, said first segment being either a sinusoidal segment or a linear segment.

3. The subject matter of claims 1 or 2 further comprising:

a second gradient coil for generating a magnetic field gradient in a second one of said three orthogonal gradient coil directions;

said gradient coil directions rotated with respect to said read and phase directions so that said desired read and phase gradient waveforms have simultaneous non-zero components in said second one of said gradient coil directions;

means for driving said second gradient coil to generate a second gradient waveform having a first segment that approximates the sum of said simultaneous non-zero components of said read and phase gradient waveforms in said second one of said gradient coil directions, said first segment being either a sinusoidal segment or a linear segment.

4. The subject matter of claim 3 further comprising:

a third gradient coil for generating a magnetic field gradient in a third one of said three orthogonal gradient coil directions;

said gradient coil directions rotated with respect to said read and phase directions so that said desired read and phase gradient waveforms have simultaneous non-zero components in said third one of said gradient coil directions;

means for driving said third gradient coil to generate a third gradient waveform having a first segment that approximates the sum of said simultaneous non-zero components of said read and phase gradient waveforms in said third one of said gradient coil directions, said first segment being either a sinusoidal segment or a linear segment.

5. The subject matter of claims 1 or 2 wherein said first gradient coil is driven to generate said first gradient waveform by a resonant power supply.

6. The subject matter of claim 5 wherein said resonant power supply includes a first capacitive element electrically connected to said first gradient coil through a first switch, said resonant circuit generating said first segment when said first switch is closed.

7. The subject matter of claim 6 wherein said first capacitive element is precharged prior to the initiation of said first gradient waveform to store energy in an amount sufficient to produce a sinusoidal resonance at a first desired amplitude when said first switch is closed.

8. The subject matter of claim 6 wherein said resonant power supply includes a second capacitive element electrically connected to said first gradient coil through a second switch, said resonant circuit generating a second segment of said first gradient waveform when said second switch is closed.

9. The subject matter of claim 8 wherein said second capacitive element is precharged prior to the initiation of said first gradient waveform to store energy in an amount sufficient to produce a sinusoidal resonance at a second desired amplitude when said second switch is closed.

10. The subject matter of claim 8 wherein said first switch is opened to terminate said first segment at substantially the same time said second switch is closed to initiate said second segment.

11. The subject matter of claim 5 wherein said first segment is a half-period sinusoidal segment.

12. The subject matter of claims 1 or 2 wherein said first segment is a horizontal segment.

13. The subject matter of claims 1 or 2 wherein said first gradient waveform is periodic.

14. The subject matter of claim 13 wherein an integral over one period of said first gradient waveform approximately equals an integral over said period of the sum of said components of said read and phase gradient waveforms in said first one of said gradient coil directions.

15. A method of generating a magnetic field for magnetic resonance imaging, said method comprising the steps of:

providing a plurality of resonant circuits, each of said resonant circuits including a capacitive element electrically connected to a current-carrying gradient coil to provide a current flow path between said capacitive element and said coil for generating at least a portion of a periodic magnetic field gradient waveform; and driving said plurality of resonant circuits to generate simultaneous periodic gradient waveforms, wherein an integral over one period of each of said waveforms is non-zero and wherein at least one of said periodic gradient waveforms is a DC-offset sinusoidal waveform.

16. Circuitry for generating a magnetic field in a magnetic resonance imaging system, said circuitry comprising:

a resonant power supply including:

a current-carrying gradient coil for generating a magnetic field gradient;

a first capacitive element electrically connected to said gradient coil through a switch, said switch having a closed state in which a first current flow path is provided between said first capacitive element and said coil, and said switch having an open state in which said first current flow path is interrupted; and a second capacitive element electrically connected to said gradient coil through a bridged network, said bridged network having a first closed state in which a second current flow path is provided between a first terminal of said second capacitive element and said coil, said bridged network having a second closed state in which a third current flow path is provided between a second terminal of said second capacitive element and said coil, and said bridged network having an open state in which said second current flow path and said third current flow path are interrupted.

17. The circuitry of claim 16 wherein said resonant power supply includes a controller for selecting said states of said switch and said bridged network to generate a gradient waveform.

18. The circuitry of claim 17 wherein said controller selects said states of said switch and said states of said bridged network in accordance with a predetermined, periodic pattern.

19. The circuitry of claim 18 wherein said bridged network includes four switches.

20. The circuitry of claim 19 wherein said switches of said bridged network are bipolar.

21. The circuitry of claim 19 wherein two of said switches of said bridged network connect to said first terminal of said second capacitive element, and a different two of said switches of said bridged network connect to said second terminal of said second capacitive element.

22. The circuitry of claim 16 wherein said resonant power supply includes an amplifier connected to said coil to drive said coil with a voltage signal synchronized to said gradient waveform.

* * * * *